May 6, 1969 O. PITZALIS, JR 3,443,241

HIGH LEVEL RF TRANSISTOR DISTORTION CORRECTION CIRCUIT

Filed July 7, 1967

INVENTOR,
OCTAVIUS PITZALIS, JR.
BY [signature] AGENT
Harry M. Saragovitz, Edward J. Kelly & Herbert Berl
ATTORNEYS.

United States Patent Office 3,443,241
Patented May 6, 1969

3,443,241
HIGH LEVEL RF TRANSISTOR DISTORTION CORRECTION CIRCUIT

Octavius Pitzalis, Jr., Fair Haven, N.J., assignor to the United States of America, as represented by the Secretary of the Army

Filed July 7, 1967, Ser. No. 651,956
Int. Cl. H03g *3/30*
U.S. Cl. 330—29 7 Claims

ABSTRACT OF THE DISCLOSURE

The distortion caused by the current-crowding effect at the higher levels of current gain in a high-beta power transistor is corrected by means of a current-limiting, control transistor in series with the high-beta transistor. The control transistor is actuated by the envelope of the amplitude-modulated input signals to vary the current through the control transistor, and the effective gain of the high-beta power transistor, in accordance with the peak level of the input signals. This insures constant amplification throughout the useful range of the transistor.

Figure 1:
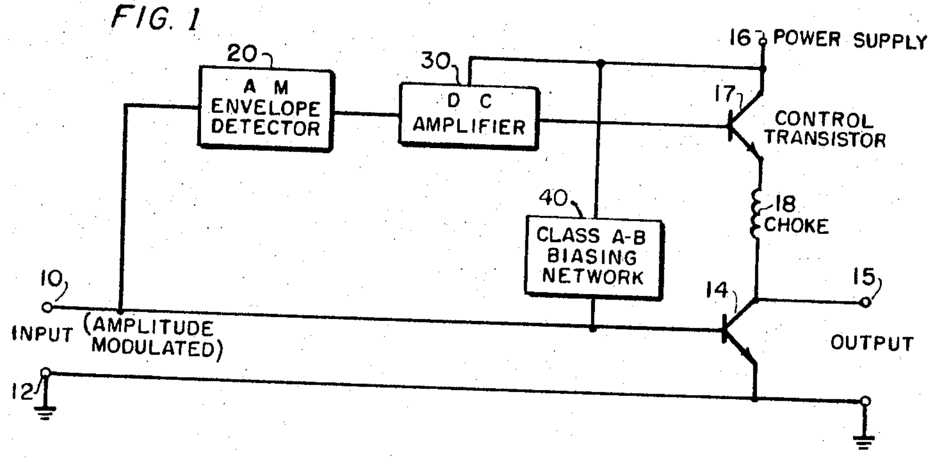

This invention relates to transistor amplifiers and particularly to RF transistor amplifiers using high-current-gain transistors at relatively high current levels. More particularly, this invention relates to a means for correcting for the distortion of amplitude-modulated, RF signals in a high-current-gain transistor at relatively high current levels.

One of the problems in high-level, current gain in transistors having a high beta is that of the current-crowding effect wherein the effective beta of the transistor decreases as the current approaches the peak level of useful current-carrying capacity of the transistor. This is caused by the reduction of active area at high current levels. This is not as pronounced in low-beta transistors as it is in high-beta transistors. Current crowding limits the magnitude of an input signal that may be amplified without excessive distortion, such as intermodulation, which is quite undesirable for single-sideband transmission. This, in turn, limits the maximum useful, current rating of a transistor to a value substantially below its maximum safe value, which decreases the optimum efficiency of power transistor circuits.

Another problem, at high current levels, is the danger of the destruction of the transistor due to second breakdown in the event of excessive peaks or loads.

Variations in gain, or amplitude distortion, of a transistor amplifier can be improved by normal feedback techniques, very well known in power amplifiers, particularly at lower frequencies and where the waveform distortion must be reduced to a minimum. However, the advantages of negative feedback can only be had with the sacrifice of gain; which means that, for the same power output, the amplifier must be driven harder, and that more gain must be available to produce a given amplification.

More compensation can be realized with envelope feedback, or control of the gain of the amplifier in accordance with the differential between the relative, instantaneous, input and output amplitude levels. This also takes care of the amplitude distortion as well as other forms of distortion, and it is the more sensitive form of feedback, but here, too, because feedback is involved, the feedback must be negative throughout the entire range of amplification to avoid oscillation. Here, too, additional, fairly-complex circuitry is necessary to detect and apply the differential or envelope feedback, and the alignment or balance is critical and quite important for effective operation.

Neither of these feedback systems reduces the possibility of second breakdown at high current levels, and both feedback systems reduce the overall efficiency.

It is therefore an object of this invention to provide an improved, high-beta, high-current-level, RF, transistor amplifier.

It is a further object of this invention to reduce the distortion and increase the efficiency of a high-current-level, RF amplifier using a high-beta transistor.

It is a further object of this invention to reduce the distortion and the possibility of second breakdown at high-current levels in a high-beta transistor amplifier for amplitude modulated, RF signals.

These and other objects of this invention are accomplished by determining the nonlinear variations in gain due to current crowding at high-current levels for a given transistor and providing a nonlinear control of the gain of the transistor to compensate for these variations. To accomplish this, a current-limiting, control transistor is connected in series with the given transistor to limit its current and, thereby, control its gain. The peak, input-signal level is detected, and amplified, and applied to the current-limiting, control transistor to vary the beta of the given, RF, power transistor in accordance with the peak amplitude level of the signals being amplified.

This invention will be better understood and further objects of this invention will become apparent from the following specification and the drawings of which:

FIGURE 1 is a circuit and block diagram of the basic device;

FIGURES 2A, B, and C are characteristic curves of typical transistors; and

Figure 3:
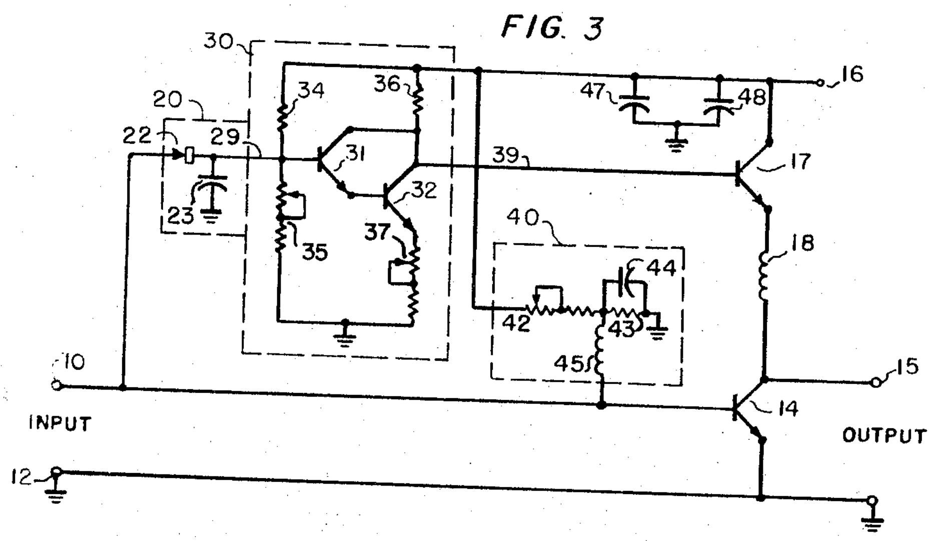

FIGURE 3 is a complete circuit diagram of a typical embodiment of this invention.

Referring now more particularly to FIGURE 1 an amplitude-modulated, RF input signal is applied across terminals 10 and 12. Terminal 12 is grounded. The amplitude-modulated, RF, input signal is applied directly to an RF, power transistor 14 which applies an output, with respect to ground, to terminal 15. A power supply 16 is connected to the RF power transistor through a control transistor 17 and an RF choke 18. The RF, power transistor 14 is maintained in a Class AB operating condition by means of a biasing network 40 in a well known manner.

The RF, input signal is also applied to an amplitude-modulation envelope detector 20 which obtains the peak amplitude level and applies it to the DC amplifier 30, which provides a signal of sufficient strength and power to actuate the control transistor 17 in accordance with the peaks of the signals being amplified.

Figure 2:
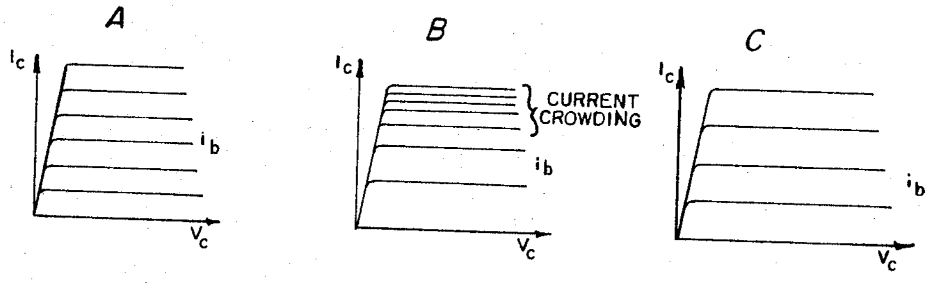

The problem is more readily seen and its solution will be more clearly understood with reference to the transistor characteristic curve of FIGURE 2.

In FIGURE 2A the $I_c—V_c$ curves for a transistor with a relatively low and linear beta show that the current gain or beta of the transistor is fairly constant from the lower to the higher input-signal levels. Here, and where a relatively low-beta transistor is used, the amplitude distortion is less severe and there would be less need for compensation.

In FIGURE 2B, however, the $I_c—V_c$ curves for a transistor with a relatively high beta show that while the beta of the transistor is quite high at the lower levels of $I_c$ it decreases rapidly at the higher levels of $I_c$, due to the current-crowding effect discussed earlier. It is this undesirable effect that this invention overcomes.

FIGURE 2C shows the effective beta of a transistor, such as 14, when the series-connected control transistor 17 is actuated by a signal from the AM envelope detector 20 and the DC amplifier 30 to decrease the gain at lower levels and to produce a substantially linear amplifier characteristic for the overall operating range of the RF power transistor.

It is noted that the change in beta is nonlinear with respect to the amplitude of the signal and that the compensation provided by the control transistor and its associated circuitry must vary with the amplitude of incoming signals to produce a constant beta at all signal levels.

FIGURE 3 shows a complete circuit diagram of a typical embodiment of this invention in a configuration similar to that of FIGURE 1 and with the same numbering of similar elements. In FIGURE 3 the AM envelope detector is inclosed in the dashed-line block 20 and is a conventional detector that includes a diode 22 and a filter capacitor 23. The RF input is connected to the diode and the output is connected to the input of the DC amplifier through conductor 29.

The DC amplifier 30 is seen in the dashed-line block 30 of FIGURE 3. This is a typical DC amplifier circuit with transistors 31 and 32 in a Darlington configuration and with resistors 34 through 37 to bias, balance, and stabilize the transistors. This DC amplifier is also connected between the power supply 16 and ground. The output of the DC amplifier is connected through conductor 39 to the control electrode of the control transistor 17.

The Class AB biasing network, inclosed in the dashed-line block 40, is also conventional and includes a voltage dividing network 42 and 43 connected between the voltage supply terminal 16 and ground. The filter capacitor 44 and the RF choke 45 isolate the AC and DC components in a well known manner.

The power supply 16 has filter capacitors 47 and 48 to eliminate all AC components from the supply.

In operation, the input signal from 10 is applied to the RF power transistor 14 and, simultaneously, to the rectifier 22 whose output is filtered by the capacitor 23 to detect the voltage level of the peaks of the amplitude-modulated, RF, input signal and apply that voltage level through conductor 29 to the input of the DC amplifier. This voltage level is DC amplified and applied through conductor 39 to the input of the current-limiting, control transistor 17.

The current-limiting control transistor 17 is set to limit the current and thereby, the gain of the power transistor at lower signal levels. As the detected voltage level increases in response to higher peaks of the RF, input signal, the control transistor is actuated to increase the current—and the gain—up to the maximum current-carrying capacity of the power transistor. This control transistor is chosen, and biased, to cause the gain or beta, of the power transistor to be effectively linear over the entire range of input signals. The amplitude modulation of the RF signal at the output 15 will, therefore, have a linear relation to the amplitude modulation of the input signals throughout the entire amplitude range.

Any source of amplitude modulated RF signals may be applied to the input terminal 10 and ground. The signal should be of sufficient level to operate the RF power transistor, and the compensating circuitry, and should come from a source of the correct impedance to match this input. Changes in voltage level, current level, or in matching impedance would be obvious to anyone skilled in the art. Similarly, the output between terminal 15 and ground will be of the effective output impedance of the transistor used, and the load connected across this output should be of a comparable impedance, for maximum efficiency. Impedance matching devices would obviously be adaptable, where necessary, in accordance with well known practices.

In the typical, gain-compensating circuit of FIGURE 3, the diode 22 is a IN914; the capacitors 23, 44, 47, and 48 are 1,000 micromicrofarads, .01 microfarad, .05 microfarad, and 5 microfarads respectively; the resistors 34, 35, 36, 37, 42, and 43 are 39K, 7K, 100 ohms, 550 ohms, 139 ohms and 1 ohm respectively; the chokes 18 and 44 are 1 microhenry and .2 microhenry respectively; and the transistors 14, 17, 31, and 32 are 2N2525, 40051 of RCA, 2N2219, and 2N2219 respectively.

The input was a single-sideband signal of 30 mHz. with two tones separated by 1 kHz. The input power level was .15 watt and the output power level was 6 to 7 watts PEP. Without the control transistor, the third-order, intermodulation-distortion products were about −18 db below the test tones. With the control transistor functioning, the linearity was improved to about −30 db down for the third-order, intermodulation-distortion products.

What is claimed is:

1. A compensating circuit for nonlinearity in the amplitude gain characteristics of a power transistor having an input and an output circuit comprising: a control transistor having an input and an output circuit; a power supply connected across the series combination of said output circuit of said power transistor and said output circuit of said control transistor; a source of amplitude-modulated signals connected to said input of said power transistor; a detecting means having an input and an output circuit; means for connecting said input circuit of said detecting means to said source of amplitude-modulated signals; means for connecting said output circuit of said detecting means to said input circuit of said control transistor to vary the gain of said power transistor directly with the amplitude of the peaks of incoming signals in the nonlinear range of said power amplifier; and utilization means connected to said output circuit of said power transistor.

2. In a compensating circuit as in claim 1 a Class AB biasing network; and means for connecting said Class AB biasing network to said input circuit of said power transistor.

3. In a compensating circuit as in claim 2 means for connecting said power supply to said Class AB biasing means.

4. In a compensating circuit as in claim 1 said means for connecting said output circuit of said detecting means to said input circuit of said control transistor comprising a DC amplifier.

5. In a compensating circuit as in claim 4 means for connecting said power supply to said DC amplifier.

6. In a compensating circuit as in claim 1 said detecting means comprising a diode and a condenser.

7. In a compensating circuit as in claim 1 an RF choke connected in series between said output circuit of said control transistor and said output circuit of said power transistor.

References Cited

UNITED STATES PATENTS

| | | | |
|---|---|---|---|
| 2,162,875 | 6/1939 | Bartels et al. | 330—136 X |
| 2,845,599 | 7/1958 | Di Toro et al. | 330—136 X |
| 3,177,439 | 4/1965 | Tulp et al. | 330—29 X |
| 3,272,915 | 9/1966 | Theriault | 325—319 X |

ROY LAKE, *Primary Examiner.*

J. B. MULLINS, *Assistant Examiner.*

U.S. Cl. X.R.

330—136